United States Patent
Cheng et al.

(10) Patent No.: US 10,147,804 B2
(45) Date of Patent: Dec. 4, 2018

(54) HIGH DENSITY VERTICAL NANOWIRE STACK FOR FIELD EFFECT TRANSISTOR

(71) Applicant: International Business Machines Corporation, Armonk, NY (US)

(72) Inventors: Kangguo Cheng, Schenectady, NY (US); Ali Khakifirooz, Los Altos, CA (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/398,478

(22) Filed: Jan. 4, 2017

(65) Prior Publication Data

US 2017/0117389 A1   Apr. 27, 2017

Related U.S. Application Data

(62) Division of application No. 14/309,976, filed on Jun. 20, 2014, now Pat. No. 9,543,440.

(51) Int. Cl.
*H01L 29/66* (2006.01)
*H01L 21/02* (2006.01)
(Continued)

(52) U.S. Cl.
CPC .. *H01L 29/66795* (2013.01); *H01L 21/02603* (2013.01); *H01L 21/30604* (2013.01);
(Continued)

(58) Field of Classification Search
CPC ......... H01L 21/02603; H01L 21/30604; H01L 21/324; H01L 29/0676; H01L 29/41791;
(Continued)

(56) References Cited

U.S. PATENT DOCUMENTS

| 7,274,051 B2 * | 9/2007 | Kim | ................. H01L 29/42384 257/210 |
| 7,374,986 B2 * | 5/2008 | Kim | ................. H01L 29/42392 257/210 |

(Continued)

OTHER PUBLICATIONS

List of IBM Patents or Patent Applications Treated as Related dated Jan. 4, 2017, 2 pages.

*Primary Examiner* — Sophia Nguyen
(74) *Attorney, Agent, or Firm* — Scully, Scott, Murphy & Presser, P.C.; Steven J. Meyers

(57) ABSTRACT

An alternating stack of layers of a first epitaxial semiconductor material and a second epitaxial semiconductor material is formed on a substrate. A fin stack is formed by patterning the alternating stack into a shape of a fin having a parallel pair of vertical sidewalls. After formation of a disposable gate structure and an optional gate spacer, raised active regions can be formed on end portions of the fin stack. A planarization dielectric layer is formed, and the disposable gate structure is subsequently removed to form a gate cavity. A crystallographic etch is performed on the first epitaxial semiconductor material to form vertically separated pairs of an upright triangular semiconductor nanowire and an inverted triangular semiconductor nanowire. Portions of the epitaxial disposable material are subsequently removed. After an optional anneal, the gate cavity is filled with a gate dielectric and a gate electrode to form a field effect transistor.

11 Claims, 12 Drawing Sheets

(51) Int. Cl.
| | |
|---|---|
| H01L 21/306 | (2006.01) |
| H01L 21/324 | (2006.01) |
| H01L 29/06 | (2006.01) |
| H01L 29/417 | (2006.01) |
| H01L 29/78 | (2006.01) |
| H01L 29/16 | (2006.01) |
| H01L 29/20 | (2006.01) |
| H01L 21/3063 | (2006.01) |
| H01L 29/201 | (2006.01) |

(52) U.S. Cl.
CPC .. *H01L 21/30608* (2013.01); *H01L 21/30617* (2013.01); *H01L 21/30635* (2013.01); *H01L 21/324* (2013.01); *H01L 29/0673* (2013.01); *H01L 29/0676* (2013.01); *H01L 29/16* (2013.01); *H01L 29/201* (2013.01); *H01L 29/2003* (2013.01); *H01L 29/41791* (2013.01); *H01L 29/66439* (2013.01); *H01L 29/66545* (2013.01); *H01L 29/785* (2013.01); *H01L 29/7854* (2013.01); *H01L 2029/7858* (2013.01); *Y10S 977/765* (2013.01); *Y10S 977/938* (2013.01)

(58) Field of Classification Search
CPC ......... H01L 29/66545; H01L 29/66795; H01L 29/785; H01L 21/02609; H01L 21/30608; H01L 21/30617; H01L 21/30635; H01L 29/0673; H01L 29/66439; H01L 29/7854; H01L 29/0684; H01L 29/201; H01L 29/16; H01L 29/2003; H01L 2029/7858; H01L 29/1033; Y10S 977/938; Y10S 977/765

See application file for complete search history.

(56) References Cited

U.S. PATENT DOCUMENTS

| | | | |
|---|---|---|---|
| 8,110,458 B2 | 2/2012 | Jin et al. | |
| 8,399,330 B2* | 3/2013 | Liu | B82Y 10/00 257/E51.04 |
| 8,399,879 B2 | 3/2013 | Liu et al. | |
| 8,785,981 B1* | 7/2014 | Chang | H01L 29/66439 257/213 |
| 9,029,835 B2* | 5/2015 | Chu-King | H01L 29/267 257/24 |
| 9,219,064 B2* | 12/2015 | Kim | H01L 27/092 |
| 9,257,527 B2* | 2/2016 | Hashemi | H01L 29/42392 |
| 9,324,869 B1* | 4/2016 | Yan | H01L 29/7853 |
| 2008/0135949 A1 | 6/2008 | Lo et al. | |
| 2008/0299742 A1* | 12/2008 | Akiyama | H01L 21/3065 438/458 |
| 2010/0187503 A1* | 7/2010 | Moriyama | B82Y 10/00 257/24 |
| 2010/0203712 A1* | 8/2010 | Coronel | B82Y 10/00 438/479 |
| 2010/0295024 A1* | 11/2010 | Pernel | B82Y 10/00 257/24 |
| 2011/0073842 A1* | 3/2011 | Liu | B82Y 10/00 257/24 |
| 2011/0284723 A1* | 11/2011 | Cao | B82Y 20/00 250/208.1 |
| 2012/0135158 A1* | 5/2012 | Freer | B82Y 10/00 427/532 |
| 2012/0138886 A1* | 6/2012 | Kuhn | B82Y 10/00 257/9 |
| 2013/0139864 A1* | 6/2013 | Hyun | H01L 35/32 136/205 |
| 2013/0175596 A1* | 7/2013 | Cheng | H01L 27/0629 257/310 |
| 2013/0270512 A1* | 10/2013 | Radosavljevic | H01L 21/823821 257/9 |
| 2013/0279145 A1* | 10/2013 | Then | H01L 29/66431 361/820 |
| 2013/0302955 A1* | 11/2013 | Vinet | B82Y 10/00 438/197 |
| 2013/0313524 A1* | 11/2013 | De Micheli | H01L 29/775 257/29 |
| 2014/0001441 A1* | 1/2014 | Kim | H01L 29/0673 257/29 |
| 2014/0034908 A1* | 2/2014 | Bangsaruntip | H01L 29/775 257/27 |
| 2014/0042386 A1* | 2/2014 | Cea | H01L 29/42392 257/9 |
| 2014/0151638 A1* | 6/2014 | Chang | H01L 29/42392 257/27 |
| 2014/0151639 A1* | 6/2014 | Chang | H01L 29/42392 257/27 |
| 2014/0151705 A1* | 6/2014 | Xiao | B82Y 10/00 257/64 |
| 2014/0273360 A1* | 9/2014 | Cheng | H01L 29/7853 438/157 |
| 2014/0353591 A1* | 12/2014 | Kim | H01L 29/42392 257/29 |
| 2014/0375379 A1* | 12/2014 | Makiyama | G05F 1/625 327/537 |
| 2015/0035071 A1* | 2/2015 | Ching | H01L 27/092 257/369 |
| 2015/0064891 A1* | 3/2015 | Cheng | H01L 29/785 438/585 |
| 2015/0097216 A1* | 4/2015 | Chen | H01L 29/045 257/255 |
| 2015/0108573 A1* | 4/2015 | Liu | H01L 21/82348 257/347 |
| 2015/0228480 A1* | 8/2015 | Yin | H01L 29/00 438/283 |
| 2015/0236145 A1* | 8/2015 | Yu | H01L 29/775 257/24 |
| 2015/0280053 A1* | 10/2015 | Gilet | B82Y 40/00 438/46 |
| 2015/0340438 A1* | 11/2015 | Zhu | H01L 29/78648 257/77 |
| 2015/0340552 A1* | 11/2015 | Amstatt | H01L 33/08 257/13 |
| 2016/0043207 A1* | 2/2016 | Kim | B82Y 10/00 257/24 |
| 2016/0086951 A1* | 3/2016 | Kim | H01L 27/092 257/351 |
| 2016/0225849 A1* | 8/2016 | Wong | H01L 29/0673 |
| 2016/0225851 A1* | 8/2016 | Li | H01L 21/02236 |
| 2017/0104062 A1* | 4/2017 | Bi | H01L 29/66545 |
| 2017/0110374 A1* | 4/2017 | Xu | H01L 21/823431 |
| 2017/0110541 A1* | 4/2017 | Xu | H01L 29/0673 |
| 2017/0117389 A1* | 4/2017 | Cheng | H01L 29/66795 |

* cited by examiner

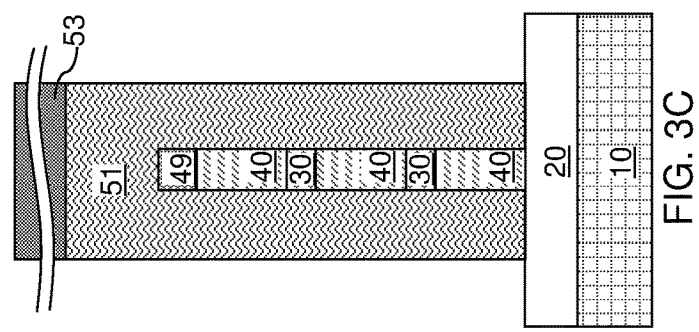
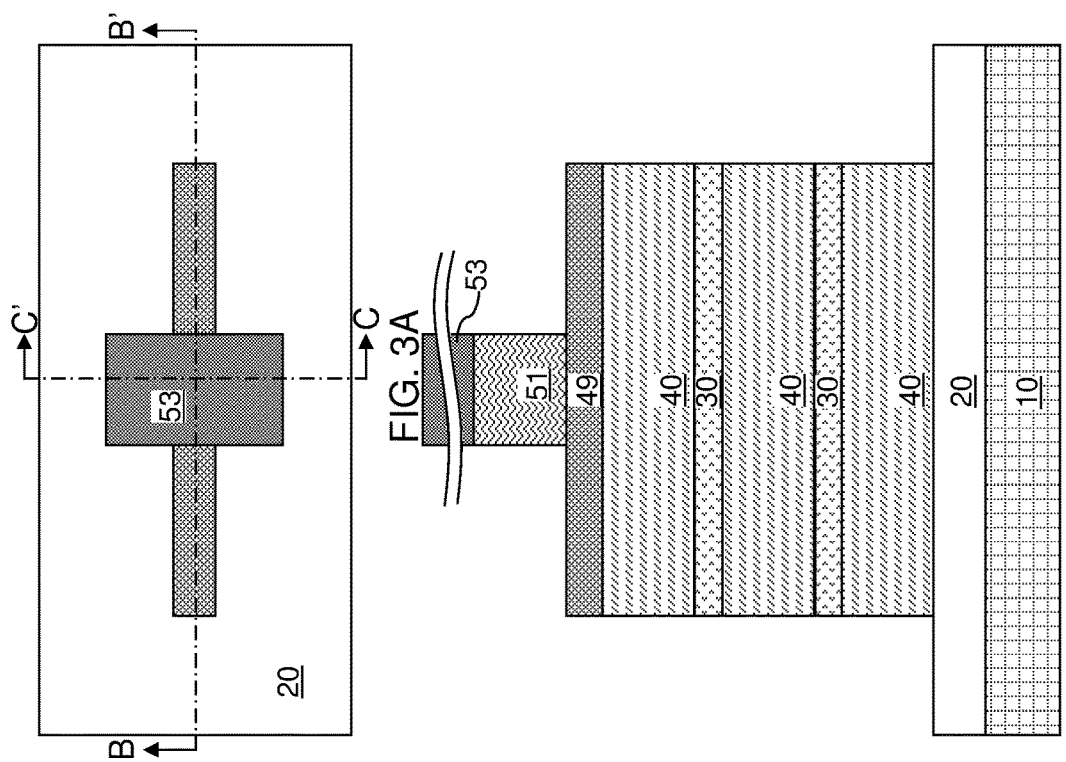
FIG. 3C
FIG. 3A
FIG. 3B

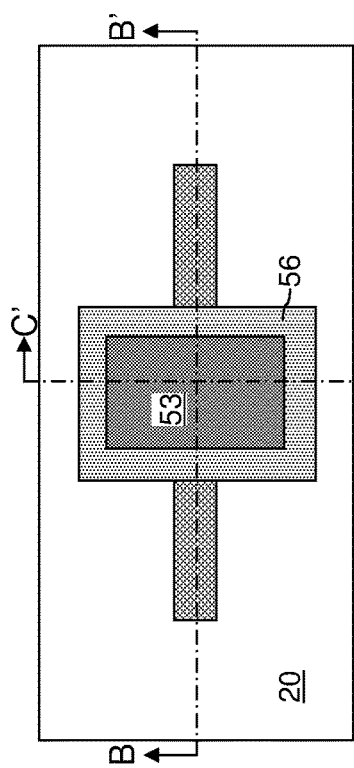
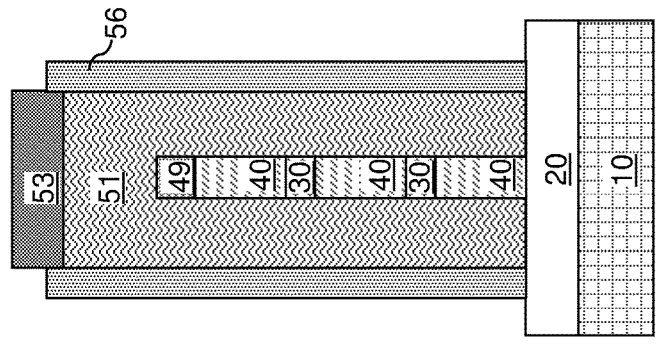
FIG. 4A
FIG. 4B
FIG. 4C

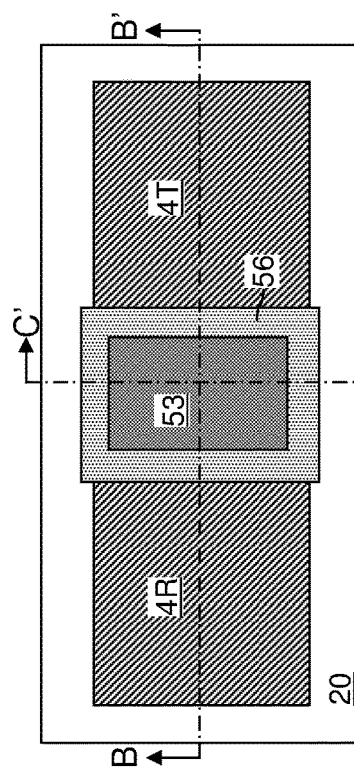
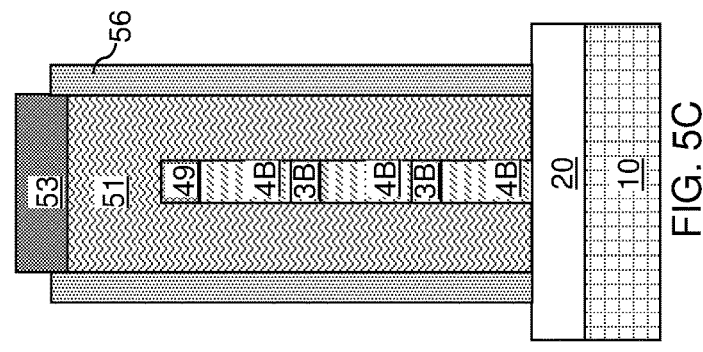
FIG. 5A
FIG. 5B
FIG. 5C

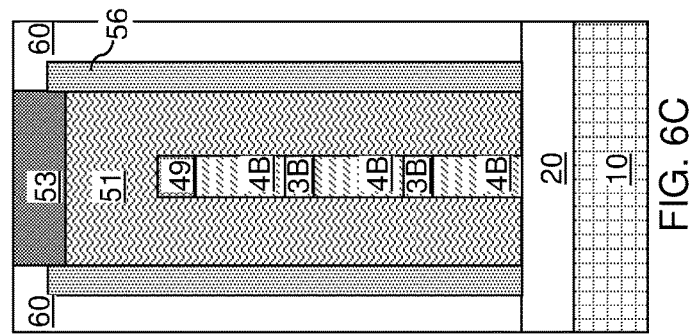
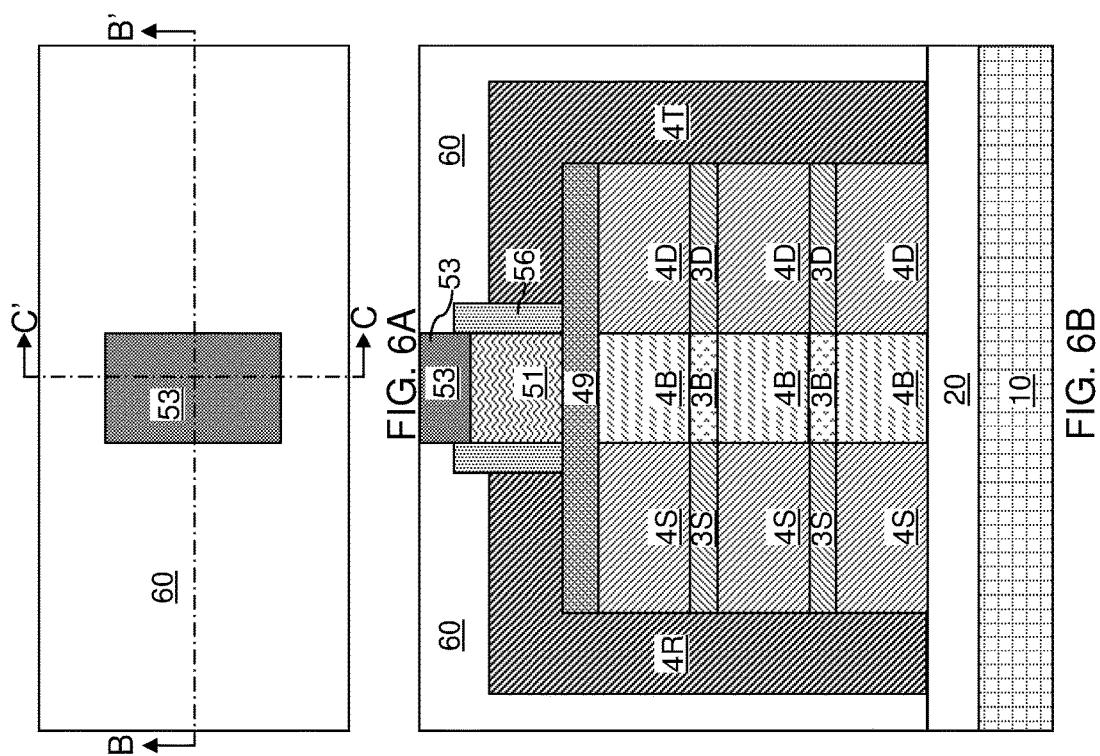

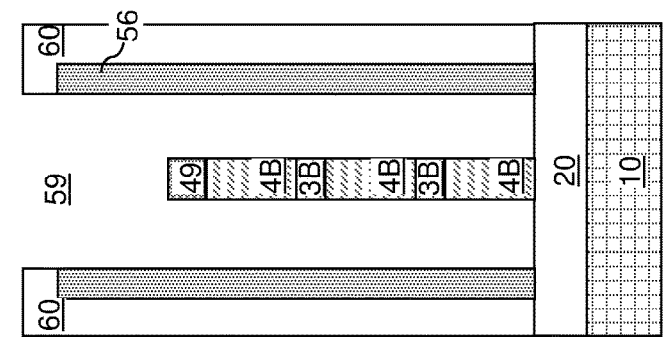
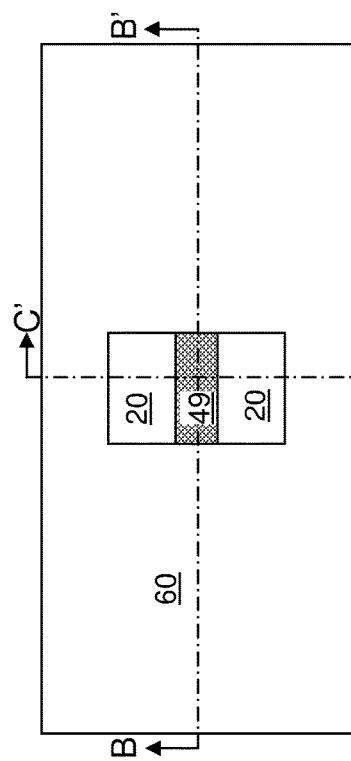
FIG. 7A
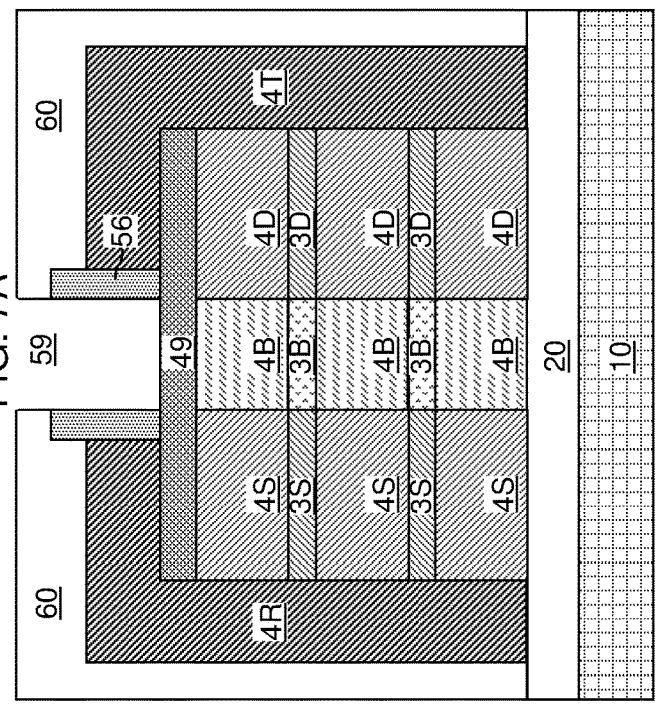
FIG. 7B
FIG. 7C

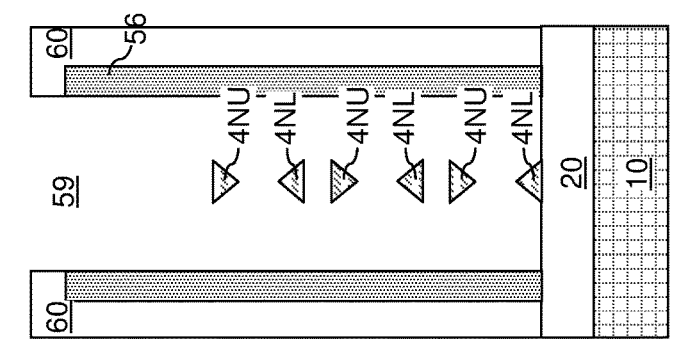
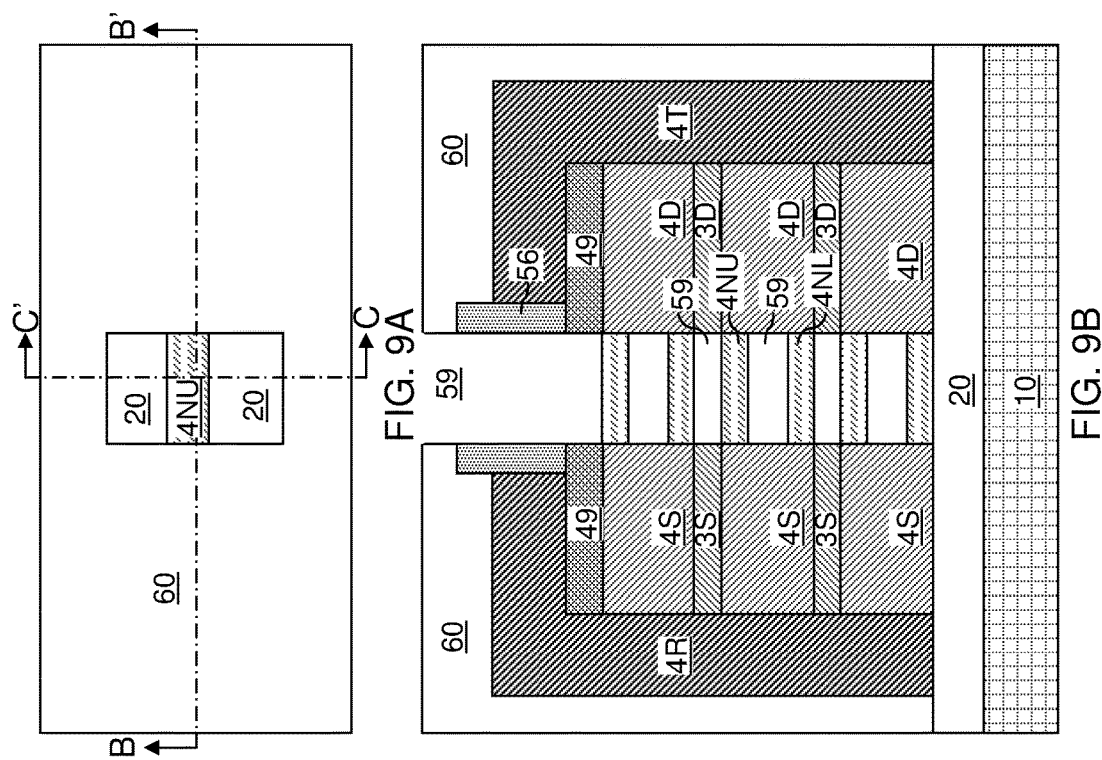

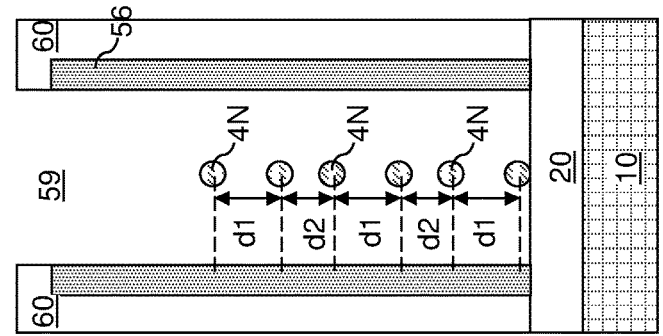
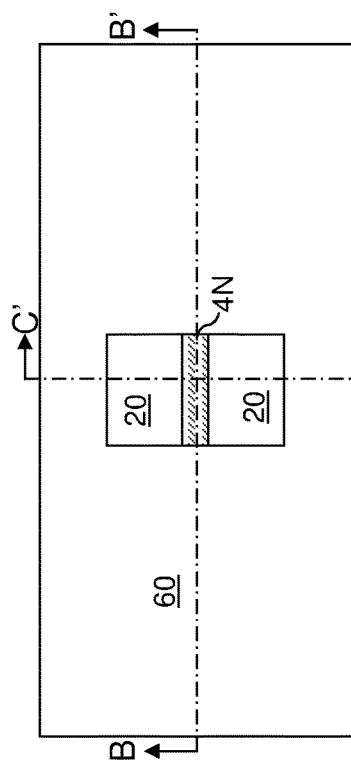
FIG. 11A
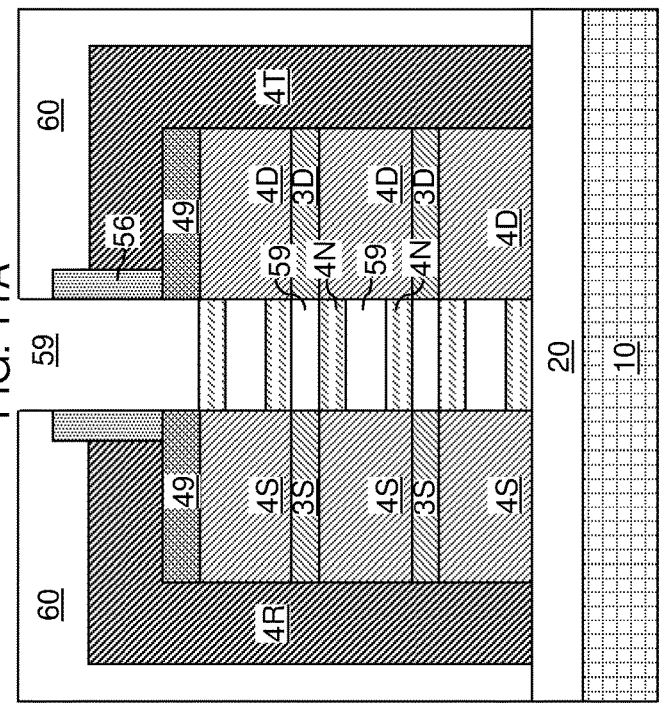
FIG. 11B
FIG. 11C

HIGH DENSITY VERTICAL NANOWIRE STACK FOR FIELD EFFECT TRANSISTOR

BACKGROUND

The present disclosure relates to a semiconductor structure, and particularly to a field effect transistor employing nanowires and a method of manufacturing the same.

Semiconductor devices employing a semiconductor nanowire, such as a nanowire field effect transistor, provides tight control of channel, enabling suppression of off-current at a level not possible with conventional fin field effect transistors. However, nanowire field effect transistors do not provide on current at a high areal current density as conventional fin field effect transistors.

To increase the on-current of nanowire field effect transistors, a vertical stack of semiconductor nanowires can be employed. The total on-current of a field effect transistor employing a vertical stack of semiconductor nanowires is proportional to the total number of semiconductor nanowires within the vertical stack.

SUMMARY

An alternating stack of layers of a first epitaxial semiconductor material and a second epitaxial semiconductor material is formed on a substrate. A fin stack is formed by patterning the alternating stack into a shape of a fin having a parallel pair of vertical sidewalls. After formation of a disposable gate structure and an optional gate spacer, raised active regions can be formed on end portions of the fin stack. A planarization dielectric layer is formed, and the disposable gate structure is subsequently removed to form a gate cavity. A crystallographic etch is performed on the first epitaxial semiconductor material to form vertically separated pairs of an upright triangular semiconductor nanowire and an inverted triangular semiconductor nanowire. Portions of the second epitaxial semiconductor material are subsequently removed. After an optional anneal, the gate cavity is filled with a gate dielectric and a gate electrode to form a field effect transistor.

According to an aspect of the present disclosure, a semiconductor structure includes at least one semiconductor nanowire pair located over a substrate. Each of the at least one semiconductor nanowire pair includes a lower semiconductor nanowire having a vertical cross-sectional shape of an upright triangle, and an upper semiconductor nanowire having a vertical cross-sectional shape of an inverted triangle.

According to another aspect of the present disclosure, a method of forming a semiconductor structure is provided. An alternating stack containing first semiconductor material portions and at least one second semiconductor material portion is formed on a substrate. Each of the first semiconductor material portions is patterned into a contiguous patterned semiconductor material portion containing a lower semiconductor nanowire having a vertical cross-sectional shape of an upright triangle, an upper semiconductor nanowire having a vertical cross-sectional shape of an inverted triangle, a semiconductor material source portion adjoined to the lower and upper semiconductor nanowires, and a semiconductor material drain portion adjoined to the lower and upper semiconductor nanowires and spaced from the source semiconductor material source portion by the lower and upper semiconductor nanowires.

BRIEF DESCRIPTION OF SEVERAL VIEWS OF THE DRAWINGS

FIG. 3A is a top-down view of the exemplary semiconductor structure after formation of a disposable gate structure according to an embodiment of the present disclosure.

FIG. 3B is a vertical cross-sectional view of the exemplary semiconductor structure along the vertical plane B-B' of FIG. 3A.

FIG. 3C is a vertical cross-sectional view of the exemplary semiconductor structure along the vertical plane C-C' of FIG. 3A.

FIG. 4A is a top-down view of the exemplary semiconductor structure after formation of a gate spacer according to an embodiment of the present disclosure.

FIG. 4B is a vertical cross-sectional view of the exemplary semiconductor structure along the vertical plane B-B' of FIG. 4A.

FIG. 4C is a vertical cross-sectional view of the exemplary semiconductor structure along the vertical plane C-C' of FIG. 4A.

FIG. 5A is a top-down view of the exemplary semiconductor structure after formation of a raised source region, a raised drain region, a source region, and a drain region according to an embodiment of the present disclosure.

FIG. 5B is a vertical cross-sectional view of the exemplary semiconductor structure along the vertical plane B-B' of FIG. 5A.

FIG. 5C is a vertical cross-sectional view of the exemplary semiconductor structure along the vertical plane C-C' of FIG. 5A.

FIG. 6A is a top-down view of the exemplary semiconductor structure after deposition and planarization of a planarization dielectric layer according to an embodiment of the present disclosure.

FIG. 6B is a vertical cross-sectional view of the exemplary semiconductor structure along the vertical plane B-B' of FIG. 6A.

FIG. 6C is a vertical cross-sectional view of the exemplary semiconductor structure along the vertical plane C-C' of FIG. 6A.

FIG. 7A is a top-down view of the exemplary semiconductor structure after formation of a gate cavity by removal of the disposable gate structure according to an embodiment of the present disclosure.

FIG. 7B is a vertical cross-sectional view of the exemplary semiconductor structure along the vertical plane B-B' of FIG. 7A.

FIG. 7C is a vertical cross-sectional view of the exemplary semiconductor structure along the vertical plane C-C' of FIG. 7A.

FIG. 9A is a top-down view of the exemplary semiconductor structure after removal of physically exposed portions of the second semiconductor material portions and a cap material portion according to an embodiment of the present disclosure.

FIG. 9B is a vertical cross-sectional view of the exemplary semiconductor structure along the vertical plane B-B' of FIG. 9A.

FIG. 9C is a vertical cross-sectional view of the exemplary semiconductor structure along the vertical plane C-C' of FIG. 9A.

FIG. 11A is a top-down view of a variation of the exemplary semiconductor structure after performing an anneal process that removes edges of the semiconductor nanowires according to an embodiment of the present disclosure.

FIG. 11B is a vertical cross-sectional view of the variation of the exemplary semiconductor structure along the vertical plane B-B' of FIG. 11A.

FIG. 11C is a vertical cross-sectional view of the variation of the exemplary semiconductor structure along the vertical plane C-C' of FIG. 11A.

DETAILED DESCRIPTION

Figure 1A:
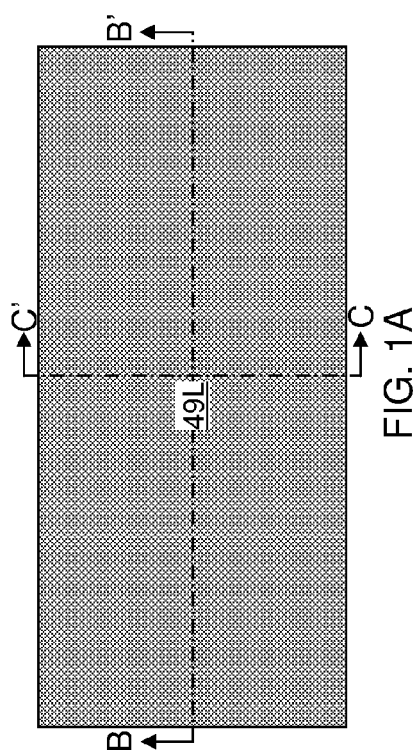
FIG. 1A is a top-down view of an exemplary semiconductor structure after formation of an alternating vertical stack of first semiconductor material layers and second semiconductor material layers and formation of a cap material layer according to an embodiment of the present disclosure.

As stated above, the present disclosure relates to a field effect transistor employing nanowires and a method of manufacturing the same. Aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

FIG. 1A is a top-down view of an exemplary semiconductor structure after formation of an alternating vertical stack of first semiconductor material layers and second semiconductor material layers and formation of a cap material layer according to an embodiment of the present disclosure.

Figure 1C:
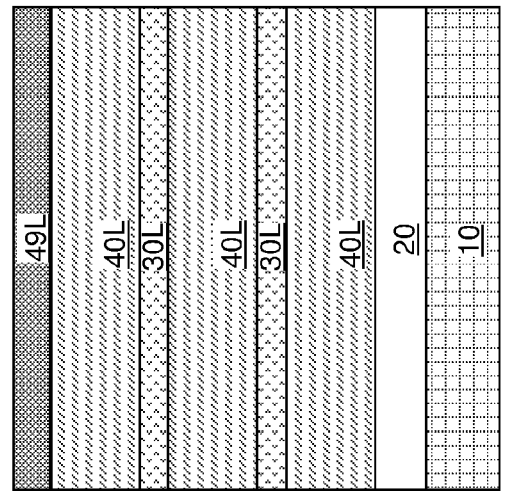
FIG. 1C is a vertical cross-sectional view of the exemplary semiconductor structure along the vertical plane C-C' of FIG. 1A.
Figure 1B:
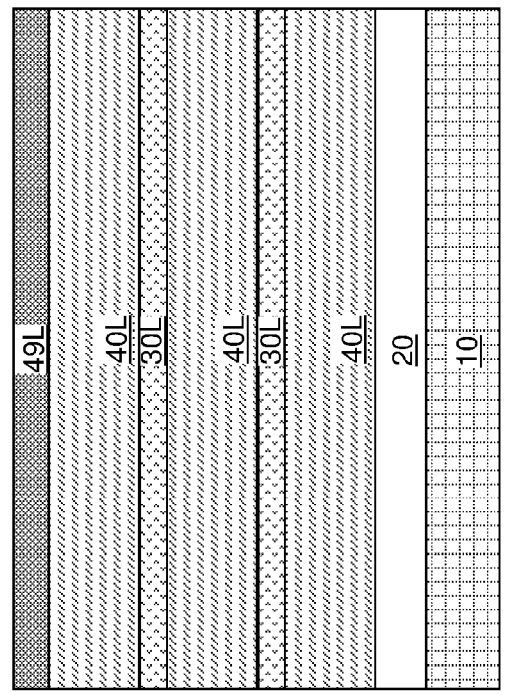
FIG. 1B is a vertical cross-sectional view of the exemplary semiconductor structure along the vertical plane B-B' of FIG. 1A.

Referring to FIGS. 1A-1C, an exemplary semiconductor structure according to an embodiment of the present disclosure includes a handle substrate 10, an insulator layer 20, and an alternating stack of a first semiconductor material and a second semiconductor material. The handle substrate 10 can include a semiconductor material, an insulator material, a conductive material, or a combination thereof. The thickness of the handle substrate 10 can be from 50 microns to 2 mm, although lesser and greater thicknesses can also be employed. The handle substrate 10 provides mechanical support for the insulator layer 20 and the alternating stack.

The insulator layer 20 includes a dielectric material such as silicon oxide, silicon nitride, silicon oxynitride, or a combination thereof. The insulator layer 20 can have a thickness in a range from 5 nm to 500 nm, although lesser and greater thicknesses can also be employed. The insulator layer 10 can have a planar top surface.

The alternating stack includes at least one first semiconductor material layer 40L and at least one second semiconductor material layer 30L. In one embodiment, the alternating stack can include a plurality of first semiconductor material layers 40L and a plurality of second semiconductor material layers 30L. As used herein, a "semiconductor material" refers to a material having a conductivity in a range from $3.0 \times 10^{-4}$ Ohm-cm to $3.0 \times 10^{3}$ Ohm-cm, and includes an intrinsic semiconductor material, a p-doped semiconductor material, an n-doped semiconductor material, or a combination of semiconductor materials having different types of doping. In one embodiment, one of the first semiconductor material layers 40L can be formed directly on the insulator layer 20. In another embodiment, one of the second semiconductor material layers 30L can be formed directly on the insulator layer. The second semiconductor material layers 30L include a second semiconductor material that can be removed selective to the first semiconductor material of the first semiconductor material layers 40L.

Each of the at least one first semiconductor material layers 40L and the second semiconductor material layers 30L can be single crystalline. In one embodiment, the entirety of the alternating stack (30L, 40L) can be single crystalline. In one embodiment, a semiconductor-on-insulator (SOI) substrate including the handle substrate 10, the insulator layer 20, and a top semiconductor material layer can be provided such that the top semiconductor material layer is the first layer among the at least one first semiconductor material layers 40L and the second semiconductor material layers 30. In other words, the top semiconductor material layer of the SOI substrate can be the first layer among the alternating stack includes at least one first semiconductor material layer 40L and at least one second semiconductor material layer 30L. In one embodiment, the insulator layer 20 can be single crystalline, and the alternating stack (30L, 40L) can be formed on the insulator layer 20 by a series of epitaxial deposition processes. In another embodiment, the insulator layer 20 can be amorphous, polycrystalline, or single crystalline, and the first semiconductor material layer of the alternating stack (30L, 40L) can be bonded to the insulator layer 20 employing a bonding process known in the art.

In one embodiment, the first semiconductor material layers 40L includes a silicon-containing semiconductor material in which the atomic concentration of silicon is greater than 80%, and the second semiconductor material layers 30L can include a germanium-containing semiconductor material in which the atomic concentration of germanium is greater than 20%. For example, the first semiconductor material layers 40L can include single crystalline silicon or a single crystalline silicon-germanium alloy in which the atomic concentration of germanium is less than 20%.

In another embodiment, the first semiconductor material layers 40L includes a first single crystalline compound semiconductor material, and the second semiconductor material layers 30L includes a second single crystalline compound semiconductor material that can be removed selective to the first single crystalline compound semiconductor material. For example, the first semiconductor material layers 40L can include $In_xGa_{1-x}As$, GaAs or InP, and the second semiconductor material layers 30L can include GaP or GaN.

In one embodiment, each of the second semiconductor material layers 30L can be deposited as a single crystalline material layer in epitaxial alignment with an underlying material layer. In one embodiment, each of the first semiconductor material layers 40L can be deposited as a single crystalline semiconductor material layer in epitaxial alignment with an underlying material layer.

The thicknesses of the second semiconductor material layers 30L and the first semiconductor material layers 40L are selected such that the entirety of the epitaxial alignment of the second semiconductor material layers 30L and the first semiconductor material layers 40L can be maintained throughout the entirety of the alternating stack (30L, 40L). Thus, the thickness of each of the second semiconductor material layers 30L and the first semiconductor material layers 40L is less than the corresponding critical thickness, which is the thickness at which an epitaxial material begins to lose epitaxial registry with the underlying single crystalline layer by developing dislocations. For example, the thickness of each of the second semiconductor material layers 30L and the first semiconductor material layers 40L can be in a range from 3 nm to 60 nm, although lesser and greater thicknesses can also be employed.

In one embodiment, the number of repetitions for a pair of a second semiconductor material layer 30L and a first semiconductor material layer 40L can be 2 or greater. In one embodiment, the number of repetitions for a pair of a second semiconductor material layer 30L and a first semiconductor material layer 40L can be in a range from, and including, 2 to, and including, 100. The alternating stack (30L, 40L) may begin, at the bottom, with a first semiconductor material layer 40L or with a second semiconductor material layer 30L. Additionally, the alternating stack may terminate, at the top, with a first semiconductor material layer 40L or with a second semiconductor material layer 30L.

A cap material layer 49L can be formed on top of the alternating stack (30L, 40L). The cap material layer 49L can include a dielectric material such as silicon nitride, silicon oxide, or a dielectric metal oxide, and can be formed by chemical vapor deposition (CVD). The thickness of the cap material layer 49L can be in a range from 3 nm to 60 nm, although lesser and greater thicknesses can also be employed.

Figure 2A:
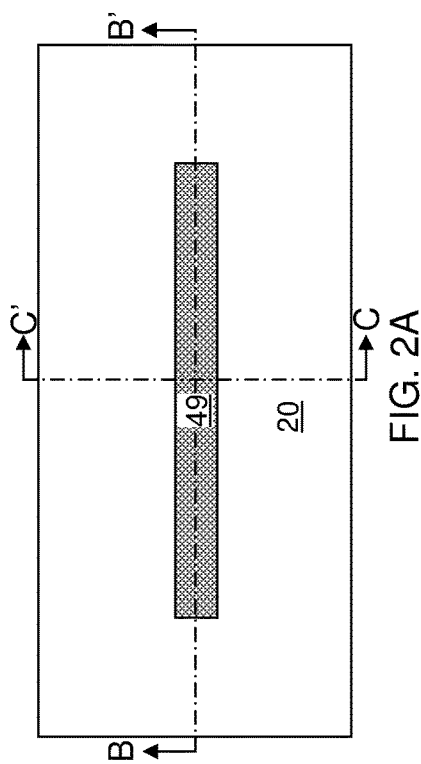
FIG. 2A is a top-down view of the exemplary semiconductor structure after formation of an alternating vertical stack of first semiconductor material portions and second semiconductor material portions according to an embodiment of the present disclosure.
Figure 2C:
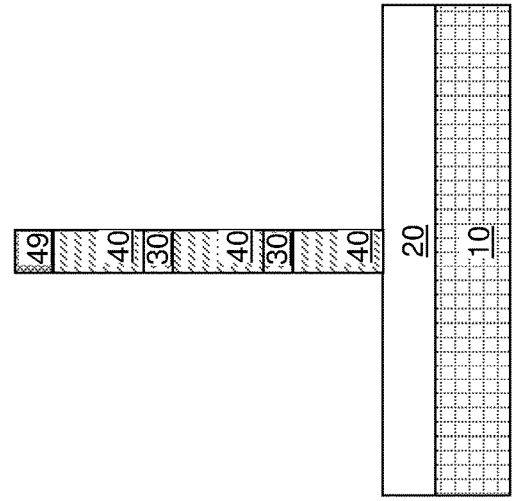
FIG. 2C is a vertical cross-sectional view of the exemplary semiconductor structure along the vertical plane C-C' of FIG. 2A.
Figure 2B:
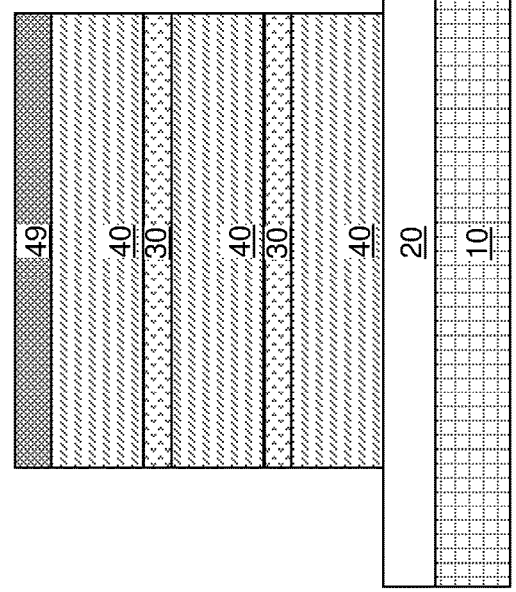
FIG. 2B is a vertical cross-sectional view of the exemplary semiconductor structure along the vertical plane B-B' of FIG. 2A.

Referring to FIGS. 2A-2C, the cap material layer 49L and the alternating stack (30L, 40L) of the first semiconductor material layers 40L and the second semiconductor material layers 30L are patterned to form a cap material portion 49 and a vertical stack (30, 40) of second semiconductor material portions 30 and first semiconductor material portions 40. For example, a photoresist layer (not shown) can be applied over the cap material layer 49L and lithographically patterned to cover a contiguous area. The shape of the contiguous area covered by the patterned photoresist layer can be selected to include an elongated region having a same width and two end portions having a greater width than the elongated region. The pattern in the photoresist layer can be transferred through the cap material layer 49L and the alternating stack (30L, 40L) of the first semiconductor material layers 40L and the second semiconductor material layers 30L by an anisotropic etch. A remaining portion of the cap material layer 49L is the cap material portion 49, and the remaining portions of the alternating stack (30L, 40L) of the first semiconductor material layers 40L and the second semiconductor material layers 30L constitute the vertical stack (30, 40) of the second semiconductor material portions 30 and the first semiconductor material portions 40. In one embodiment, the entirety of the vertical stack (30, 40) of the second semiconductor material portions 30 and the first semiconductor material portions 40 can be single crystalline. Besides the lithography patterning, other patterning techniques such as sidewall imaging transfer, multiple patterning, or the combination of those techniques can be used to pattern the stack.

In one embodiment, each of the second semiconductor material portions 30 and the first semiconductor material portions 40 can have a uniform width in a range from 10 nm to 100 nm. The second semiconductor material portions 30 and the first semiconductor material portions 40 can have sidewalls that are vertically coincident among one another. As used herein, surfaces are "vertically coincident" if the surfaces are located within a same vertical plane. In one embodiment, second semiconductor material portions 30 and the first semiconductor material portions 40 can have a same horizontal cross-sectional shape. In one embodiment, the first semiconductor material portions 40 and the second semiconductor material portions 30 can be semiconductor material fins and second semiconductor material fins, respectively. As used herein, a "fin" refers to a structure having a pair of vertical sidewalls and a uniform width between the pair of vertical sidewalls that is invariant under translation along the direction of the vertical sidewalls. The vertical stack (30, 40) of the second semiconductor material portions 30 and the first semiconductor material portions 40 constitutes a semiconductor fin having a pair of parallel sidewalls that extend along a lengthwise direction and having a uniform width throughout. As used herein, a "lengthwise direction" is a horizontal direction around which an axis passing through a center of mass of an element would have the least moment of inertia.

In one embodiment, the second semiconductor material portions 30 and the first semiconductor material portions 40 can be single crystalline and epitaxially aligned among one another. Further, the second semiconductor material portions 30 and the first semiconductor material portions 40 can have different lattice constants. In this case, the second semiconductor material portions 30 and the first semiconductor material portions 40 can be in opposite types of stress along horizontal directions.

The cap material layer 49L and the cap material portion 49 can be optional, i.e., may be present or not present. If present, the cap material portion 49 may be employed as a hard mask during the patterning of the vertical stack (30, 40) of the second semiconductor material portions 30 and the first semiconductor material portions 40. Further, the cap material portion 49 can be removed once the vertical stack (30, 40) of the second semiconductor material portions 30 and the first semiconductor material portions 40 is formed, for example, by a wet etch that removes the material of the cap material portion 49 selective to the insulator layer 20 and the vertical stack (30, 40) of the second semiconductor material portions 30 and the first semiconductor material portions 40.

Referring to FIGS. 3A-3C, a disposable gate structure (51, 53) can be formed over, and across, the cap material portion 49 and the vertical stack (30, 40) of the second semiconductor material portions 30 and the first semiconductor material portions 40. In one embodiment, the disposable gate structure (51, 53) can include a disposable gate portion 51 and a disposable gate cap 53. In one embodiment, the disposable gate portion 51 can include a dielectric material that is different from the dielectric material of the insulator layer 20. For example, the disposable gate portion 51 can include amorphous carbon, diamond-like carbon (DLC), a dielectric metal oxide, silicon nitride, or an organosilicate glass. Alternatively, the disposable gate portion 51 can include a stack of a disposable material liner (not shown) and a disposable gate material portion (not shown). In this case, the disposable material liner can include a dielectric material such as silicon oxide. The disposable gate material portion can include a dielectric material, a semiconductor material, or a conductive material, provided that the disposable gate material portion can be removed selective to the dielectric materials of a planarization dielectric layer and a gate spacer to be subsequently formed. The disposable gate cap 53 can include a dielectric material that is different from the dielectric material of the planarization dielectric layer to be subsequently formed. For example, the disposable gate cap 53 can include silicon nitride.

The disposable gate structure (51, 53) can be formed by deposition and patterning of at least one material layer. The patterning of the at least one material layer can be performed by a combination of lithographic methods and an anisotropic etch. The disposable gate structure (51, 53) straddles, and contacts sidewalls of, the vertical stack (30, 40) of the second semiconductor material portions 30 and the first semiconductor material portions 40.

Referring to FIGS. 4A-4C, a gate spacer 56 can be formed around the disposable gate structure (51, 53). Specifically, the gate spacer 56 can be formed by depositing a conformal dielectric material layer on the disposable gate structure (51, 53) and the vertical stack (30, 40) of the second semiconductor material portions 30 and the first semiconductor material portions 40, and anisotropically etching the conformal dielectric material layer. The conformal dielectric material layer includes a dielectric material that is different from the material of the disposable gate portion 51. For example, the conformal dielectric material layer can include silicon nitride, silicon oxide, and/or dielectric metal oxide.

An anisotropic etch process is employed to anisotropically etch horizontal portions of the conformal dielectric material layer. Further, vertical portions of the conformal dielectric material layer are recessed so that the sidewalls of the vertical stack (30, 40) of the second semiconductor material portions 30 and the first semiconductor material portions 40 are physically exposed. The disposable gate cap 53 may be collaterally etched to become thinner during the anisotropic etch process.

Referring to FIGS. 5A-5C, a selective epitaxy process can be performed to form a raised source region 4R and a raised drain region 4T. During the selective epitaxy process, a semiconductor material is deposited only on semiconductor surfaces, and does not nucleate on dielectric surfaces. The raised source region 4R grows from surfaces of the first semiconductor material portions 40 (See FIGS. 4A-4C) located on one side of the disposable gate structure (51, 53), and the raised drain region 4T grows from surfaces of the first semiconductor material portions 40 located on the other side of the disposable gate structure (51, 53). If the second semiconductor material portions include semiconductor surfaces, the raised source region 4R and the raised drain region 4T can grow from surfaces of the second semiconductor material portions 30 (See FIGS. 4A-4C). Each of the raised source region 4R and the raised drain region 4T can be single crystalline, and can be epitaxially aligned to the single crystalline structure of the vertical stack of the second semiconductor material portions 30 and the first semiconductor material portions 40. The raised source region 4R and the raised drain region 4T can be formed with in-situ doping of the electrical dopants, or by deposition of an intrinsic semiconductor material and subsequent introduction of electrical dopants by ion implantation, plasma doping, gas phase doping, or outdiffusion from a disposable doped silicate glass layer.

A source region (3S, 4S) and a drain region (3D, 4D) can be formed on portions of the vertical stack (30, 40) of the second semiconductor material portions 30 and the first semiconductor material portions 40 that underlie the raised source region 4R and the raised drain region 4T, respectively by introduction of electrical dopants, which can be p-type dopants or n-type dopants. The source region (3S, 4S) and the drain region (3D, 4D) can be formed prior to formation of the raised source region 4R and the raised drain region 4T by implantation of the electrical dopants, for example, by ion implantation. Alternatively, the source region (3S, 4S) and the drain region (3D, 4D) can be formed after formation of the raised source region 4R and the raised drain region 4T by outdiffusion of the electrical dopants during an anneal process from the raised source region 4R and the raised drain region 4T, respectively, and/or by implantation of the electrical dopants.

In one embodiment, the combination of the disposable gate structure (51, 53) and the gate spacer 56 can be employed as masking structures during introduction of the electrical dopants. Alternately or additionally, electrical dopants may also be introduced prior to formation of the gate spacer 56.

The source region (3S, 4S) includes at least one first semiconductor material source portion 4S and at least one second semiconductor material source portion 3S. Each first semiconductor material source portion 4S is a contiguous portion of the source region (3S, 4S) that includes a sub-portion of one of the at least one first semiconductor material portion 40. Each second semiconductor material source portion 3S is a contiguous portion of the source region (3S, 4S) that includes a sub-portion of one of the at least one second semiconductor material portion 30. Each first semiconductor material drain portion 4D is a contiguous portion of the drain region (3D, 4D) that includes a sub-portion of one of the at least one first semiconductor material portion

40. Each second semiconductor material drain portion 3D is a contiguous portion of the drain region (3D, 4D) that includes a sub-portion of one of the at least one second semiconductor material portion 30. Each remaining portion of a first semiconductor material portion 40 constitutes a first semiconductor material gate-region portion 4B, which is subsequently etched to form a pair of semiconductor nanowires. Each remaining portion of a second semiconductor material portion 30 constitutes a second semiconductor material gate-region portion 3B, which is subsequently removed.

The entirety of the source region (3S, 4S) collectively constitutes a doped semiconductor fin having a parallel pair of sidewalls and having a uniform width. The entirety of the drain region (3D, 4D) collectively constitutes another doped semiconductor fin having a parallel pair of sidewalls and having the same uniform width. The stack of the first semiconductor material gate-region portions 4B and the second semiconductor material gate-region portions 3B collectively constitute a semiconductor fin having a parallel pair of sidewalls and having the same uniform width. A second semiconductor material portion (3S, 3D, 3B) is present between each vertically neighboring pair of first semiconductor material portions (4S, 4D, 4B) among the alternating stack of the first semiconductor material portions (4S, 4D, 4B) and at least one second semiconductor material portion (3S, 3D, 3B).

Referring to FIGS. 6A-6C, a planarization dielectric layer 60 is deposited over the alternating stack (4S, 4D, 4B, 3S, 3D, 3B), the raised source region 4R, and the raised drain region 4T, and around the disposable gate structure (51, 53). The planarization dielectric layer 60 includes a dielectric material different from the material of the disposable gate structure (51, 53). For example, the planarization dielectric layer 60 can include undoped silicate glass, doped silicate glass, organosilicate glass, and/or silicon nitride. In one embodiment, the planarization dielectric layer 60 includes organosilicate glass. The top surface of the planarization dielectric layer 60 can be planarized employing the top surface of the disposable gate structure (51, 53) as a stopping surface. Upon planarization, the top surface of the planarization dielectric layer 60 can be planar, i.e., two-dimensional, and can be coplanar with the top surface of the disposable gate structure (51, 53).

Referring to FIGS. 7A-7C, the disposable gate structure (51, 53) can be subsequently removed selective to the planarization dielectric layer 60 by at least one etch process, which can include an isotropic etch and/or an anisotropic etch. For example, the disposable gate structure (51, 53) can be removed selective to the planarization dielectric layer 60 by wet etch processes. A gate cavity 59 is formed in the volume from which the disposable gate structure (51, 53) is removed. Sidewall surfaces of each of the first semiconductor material portions (4S, 4D, 4B) and sidewall surfaces of each of the second semiconductor material portions (3S, 3D, 3B) are physically exposed in the gate cavity 59. Specifically, the sidewalls of the first semiconductor material gate-region portions 4B and the second semiconductor material gate-region portions 3B are physically exposed inside the gate cavity 59.

Figure 8C:
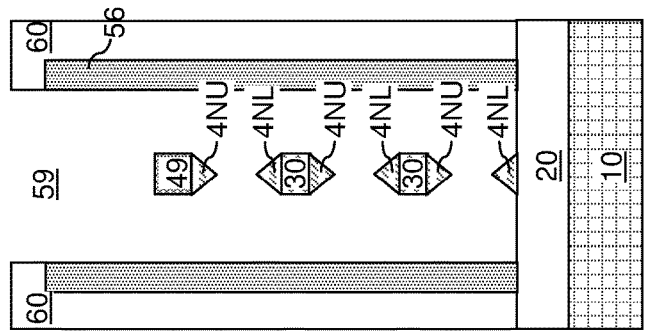
FIG. 8C is a vertical cross-sectional view of the exemplary semiconductor structure along the vertical plane C-C' of FIG. 8A.
Figure 8A:
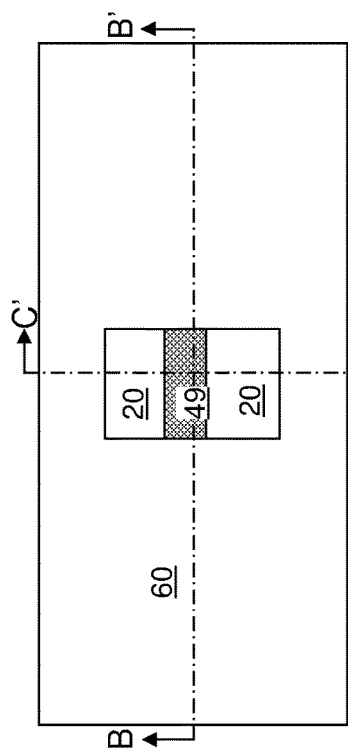
FIG. 8A is a top-down view of the exemplary semiconductor structure after formation of semiconductor nanowire pairs by a crystallographic etch on physically exposed portions of the first semiconductor material portions according to an embodiment of the present disclosure.
Figure 8B:
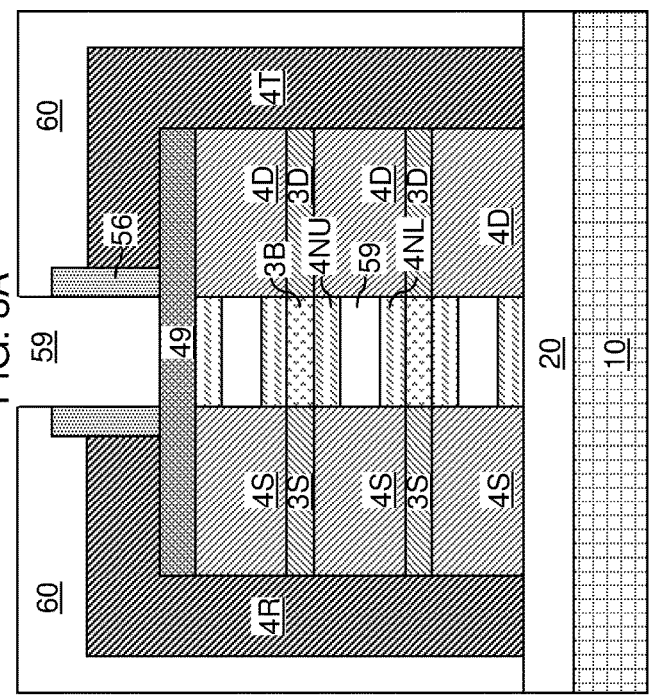
FIG. 8B is a vertical cross-sectional view of the exemplary semiconductor structure along the vertical plane B-B' of FIG. 8A.

Referring to FIGS. 8A-8C, a crystallographic etch is performed on the first semiconductor material gate-region portions 4B. The crystallographic etch is an anisotropic etch that provides different etch rates for different crystallographic orientations of the surfaces of the first semiconductor material of the first semiconductor material gate-region portions 4B. Thus, the crystallographic etch is a crystallographic anisotropic etch. The crystallographic etch can be selective to the second semiconductor material of the second semiconductor material gate-region portions 3B.

The crystallographic anisotropic etch may employ a wet etch process or a reactive ion etch process. The crystallographic anisotropic etch provides anisotropic etch rates along different crystallographic orientations of the substrate. A high etch rate crystallographic facet, which has a high etch rate for a given crystallographic anisotropic etch, moves rapidly in the direction normal to the facet. Conversely, a low etch rate crystallographic facet, which has a low etch rate for a given crystallographic anisotropic etch, moves slowly in the direction normal to the facet. It is noted that "high" or 'low" etch rates are relative to each other i.e., measured against etch rates along different orientations of the same material in a given etch process. The ratio of the etch rates between the high etch rate crystallographic facet and the etch rate crystallographic facet is about 3 or greater, and preferably about 10 or greater, and more preferably about 30 or greater. Oftentimes, the area of a low etch rate crystallographic facet may increase as a high etch rate crystallographic facet slides along the surface of the low etch rate crystallographic facet. A prolonged crystallographic anisotropic etch tends to form predominantly low etch rate crystallographic facets in a resulting structure, while a prematurely terminated crystallographic anisotropic etch tends to form both high etch rate crystallographic facets and low etch rate crystallographic facets.

In one embodiment, the first semiconductor material can be silicon. In this case, the following exemplary crystallographic anisotropic etch processes may be used to form low etch rate crystallographic facets having {111} orientations from first semiconductor material gate-region portions 40B including silicon. A first example of such a process is a wet etch process utilizing a pure TMAH (tetramethyl-ammonium hydroxide; $(CH_3)_4NOH$) solution, which produces {111} facets due to a low etch rate perpendicular to {111} facets. A second example is a wet etch process which comprises a pretreatment with SC1 clean consisting of a mixture of $H_2O$, $NH_4OH$, and $H_2O_2$, followed by an etch in a dilute hydrofluoric acid (DHF), then followed by another etch in an ammonium hydroxide solution ($NH_4OH$). This process also has a low etch rate perpendicular to {111} facets compared to other facets. A third example is a reactive ion etch used for deep trench formation in the DRAM processes, which tends to produce {111} facets on the surface of the semiconductor material.

Alternatively, the following exemplary crystallographic anisotropic etch process may be used to form low etch rate crystallographic facets having {100} orientations from first semiconductor material gate-region portions 4B including silicon. The exemplary crystallographic anisotropic etch process comprises a pretreatment in a dilute hydrofluoric acid (DHF), followed by drying in an environment containing isopropyl alcohol (IPA) vapor, then followed by an etch in an ammonium hydroxide ($NH_4OH$) solution.

In general, for an arbitrary first semiconductor material in the first semiconductor material gate-region portions 4B, a wet etch process or a reactive ion etch processes may be employed as a crystallographic anisotropic etch as long as the etchant has an anisotropic etch rate along different crystallographic planes. In the case of an anisotropic wet etch process, the first semiconductor material gate-region portions 4B may be pretreated with a chemical that modifies the ratio of etch rates along different crystallographic planes of the first semiconductor material gate-region portions 4B prior to subjecting the exposed semiconductor surface to the etchant.

Preferably, the crystallographic facets are major crystallographic surfaces with low Miller indices such as {100}, {110}, {111}, {211}, {221}, {311}, {321}, {331}, and {332}. In general, if none of the indices have numbers exceeds 6 in magnitude, the corresponding crystallographic surface may be considered a major crystallographic surface with low Miller indices.

The angle between the surface normals of the crystallographic facets and the vertical planes parallel to the sidewalls of the doped semiconductor fins of the source region (3S, 4S) and the drain region (3D, 4D) can be less than 90 degrees. Typically, a pair of low etch rate crystallographic facets are formed in the remaining sub-portions of the first semiconductor material gate-region portions 4B. While the angle between facets may vary depending on the crystallographic orientation of the first semiconductor material gate-region portions 4B (which have the same crystallographic orientation), and the surface orientations (crystallographic orientations of the facets) obtained from the crystallographic etch process, a edge is formed where two facets are adjoined to each other.

A pair of semiconductor nanowires 4N is formed by the crystallographic etch that is performed on the physically exposed surfaces of the first semiconductor material portions (4S, 4D, 4B). The crystallographic etch patterns each first semiconductor material portions (4S, 4D, 4B) into a contiguous patterned semiconductor material portion (4S, 4D, 4NL, 4NU) containing a lower semiconductor nanowire 4NL having a vertical cross-sectional shape of an upright triangle, an upper semiconductor nanowire 4NU having a vertical cross-sectional shape of an inverted triangle, a first semiconductor material source portion 4S adjoined to the lower and upper semiconductor nanowires (4NL, 4NU), and a first semiconductor drain portion 4D adjoined to the lower and upper semiconductor nanowires (4NL, 4NU) and spaced from the first semiconductor material source portion 4S by the lower and upper semiconductor nanowires (4NL, 4NU). Surfaces of the lower and upper semiconductor nanowires (4NL, 4NU) are crystallographic semiconductor surfaces adjoined to one another by edges.

As used herein, an "upright" triangle is a triangle having two sides that are adjoined to each other at top ends thereof and having a third side that is horizontal and adjoined to bottom ends of the two sides. As used herein, an "inverted" triangle is a triangle having two sides that are adjoined to each other at bottom ends thereof and having a third side that is horizontal and adjoined to top ends of the two sides.

At least one semiconductor nanowire pair (4NL, 4NU) can be formed from the at least one 4S, 4D, 4B). In one embodiment, the at least one semiconductor nanowire pair (4NL, 4NU) can be a plurality of semiconductor nanowire pairs (4NL, 4NU) that are vertically spaced from one another and located within a same area in a top-down view along a direction perpendicular to a top surface of the substrate (10, 20). In one embodiment, within each pair of a lower semiconductor nanowire 4NL and an upper semiconductor nanowire 4NU, an edge defining topmost points of the lower semiconductor nanowire 4NL and an edge defining bottommost points of the upper semiconductor nanowire 4NU can be within a same vertical plane that is spaced by a same distance from the two common vertical planes including the sidewalls of the source region (3S, 4S) and the sidewalls of the drain region (3D, 4D) that extend along the lengthwise direction of the source region (3S, 4S) and the drain region (3D, 4D). In one embodiment, each lower semiconductor nanowire 4NL and each upper semiconductor nanowire 4NU can be adjoined to a first semiconductor material source portion 4S having a rectangular vertical cross-sectional shape and a first semiconductor material drain portion 4D having another rectangular vertical cross-sectional shape. The direction of the rectangular vertical cross-sectional shapes can be perpendicular to the two common vertical planes including the sidewalls of the source region (3S, 4S) and the sidewalls of the drain region (3D, 4D).

In one embodiment, the entirety of the lower semiconductor nanowires 4NL, the upper semiconductor nanowires 4NU, the first semiconductor material source portions 4S, and the first semiconductor material drain portions 4D can be single crystalline.

In one embodiment, non-horizontal surfaces of the lower and upper semiconductor nanowires (4NL, 4NU) can be crystallographic surfaces having Miller indices that are equivalent under lattice symmetry of a single crystalline semiconductor material, i.e., the first semiconductor material, of the lower and upper semiconductor nanowires (4NL, 4NU).

In one embodiment, the crystallographic anisotropic etch can be selective to the second semiconductor material of the at least one second semiconductor material portion (3S, 3D, 3B). In another embodiment, the crystallographic anisotropic etch can remove the semiconductor material of the at least one second semiconductor material portion (3S, 3D, 3B) concurrently with removal of the first semiconductor material.

Referring to FIGS. 9A-9C, in case the crystallographic anisotropic etch does not etch physically exposed portions of the at least one second semiconductor material portion (3S, 3D, 3B) within the gate cavity 59, an etch process is performed to remove a physically exposed sub-portion of each second semiconductor material portion (3S, 3D, 3B) selective to the contiguous patterned semiconductor material portions (4S, 4D, 4NL, 4NU). Specifically, physically exposed sub-portions of the at least one second semiconductor material portion (3S, 3D, 3B), i.e., the second semiconductor material of the at least one second semiconductor material gate-region portion 3B, are removed selective to the contiguous patterned semiconductor material portions (4S, 4D, 4NL, 4NU). An isotropic etch chemistry that removes the second semiconductor material selective to the first semiconductor material can be employed. For example, if the first semiconductor material includes silicon and the second semiconductor material includes a silicon-germanium alloy or germanium, a wet etch employing a combination of hydrogen peroxide and dilute hydrofluoric acid can be employed.

After, or prior to, removal of the physically exposed sub-portions of the at least one second semiconductor material portion (3S, 3D, 3B), another etch process can be performed to remove a sub-portion of the cap material portion 49 in the gate cavity 59. An anisotropic etch or an isotropic etch can be employed. For example, an anisotropic etch that is selective to the first semiconductor material can be performed to remove the sub-portion of the cap material portion 49 in the gate cavity 59.

The exemplary semiconductor structure includes at least one second semiconductor material source portion 3S located between each vertically neighboring pair of first semiconductor material source portions 4S, and at least one second semiconductor material drain portion 3D located between each vertically neighboring pair of first semiconductor material drain portions 4D. The second semiconductor material of the at least one second semiconductor material source portion 3S and the at least one second semiconductor material drain portion 3D is different from the first semiconductor material of the first semiconductor material source portions 4S and the first semiconductor material drain portions 4D. The at least one second semiconductor material source portion 3S and the at least one second semiconductor material drain portion 3D can be single crystalline, and can be epitaxially aligned to the first semiconductor material source portions 4S and the first semiconductor material drain portions 4D.

Figure 10C:
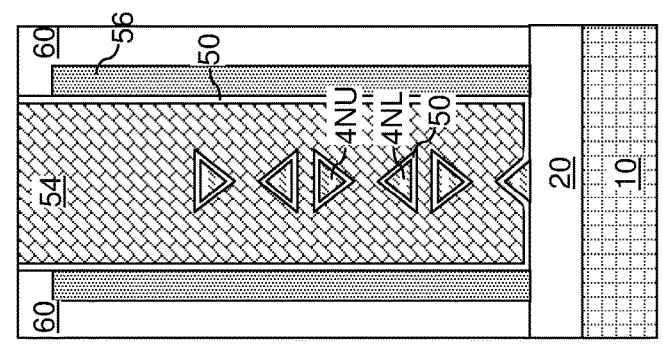
FIG. 10C is a vertical cross-sectional view of the exemplary semiconductor structure along the vertical plane C-C' of FIG. 10A.
Figure 10A:
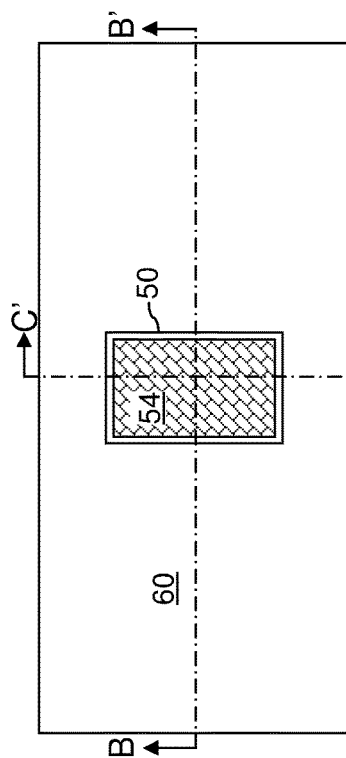
FIG. 10A is a top-down view of the exemplary semiconductor structure after formation of a replacement gate structure including a gate dielectric and a gate electrode according to an embodiment of the present disclosure.
Figure 10B:
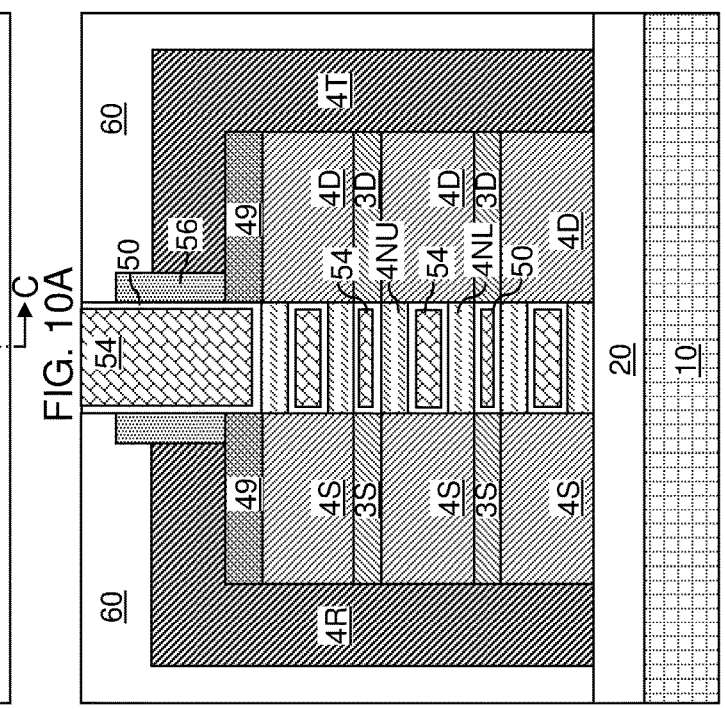
FIG. 10B is a vertical cross-sectional view of the exemplary semiconductor structure along the vertical plane B-B' of FIG. 10A.

Referring to FIGS. 10A-10C, a replacement gate structure (50, 54) is formed within the gate cavity 59 by deposition of a gate dielectric layer and at least one conductive material layer, and subsequent removal of the portions of the gate dielectric layer and the at least one conductive material layer from above the top surface of the planarization dielectric layer 60, for example, by chemical mechanical planarization (CMP). The remaining portion of the gate dielectric layer constitutes a gate dielectric 50, and the remaining portion of the at least one conductive material layer constitutes a gate electrode 54. The replacement gate structure (50, 54) is a gate structure having a volume that is greater than the volume of the disposable gate structure (51, 53; See FIGS. 6A-6C).

In one embodiment, the gate dielectric 50 can include a dielectric metal oxide having a dielectric constant greater than 8.0. The thickness of the gate dielectric 50 can be from 1 nm to 3 nm, although lesser and greater thicknesses can also be employed. The gate dielectric 50 is formed on the faceted surfaces of the lower and upper semiconductor nanowires (4NL, 4NU), and the gate electrode 54 is formed on the gate dielectric 50. Within each pair of lower and upper semiconductor nanowires (4NL, 4NU), the upper semiconductor nanowire 4NU is vertically spaced from the lower semiconductor nanowire 4NL by a portion of the gate electrode 54.

Referring to FIGS. 11A-11C, a variation of the exemplary semiconductor structure can be derived from the exemplary semiconductor structure of FIGS. 9A-9C by rounding the pairs of lower and upper semiconductor nanowires (4NL, 4NU) by performing an anneal process at an elevated temperature. The temperature of the anneal can be in a range from 600° C. to 1,000° C., although lesser and greater temperatures can also be employed. The anneal process can be performed in a hydrogen-containing ambient to induce reflow of the first semiconductor material of the lower and upper semiconductor nanowire (4NL, 4NU). The anneal process removes edges of the semiconductor nanowires (4NL, 4NU) to form circular semiconductor nanowires 4N having a substantially circular vertical cross-sectional shape. Accordingly, the crystallographic semiconductor surfaces of the lower and upper semiconductor nanowires (4NL, 4NU).

In one embodiment, a plurality of first semiconductor material portions 40 can be formed with the same first thickness, and a plurality of second semiconductor material portions 30 can be formed with the same second thickness. See FIGS. 2A-2C. In this case, the center-to-center distance between neighboring pairs of semiconductor nanowires 4N after removal of the edges and rounding of the first semiconductor material can be a first distance d1 for each pair derived from the same first semiconductor material portion 40, and a second distance d2 for each pair derived from a neighboring pair of first semiconductor material portions 40. The second distance d2 can be different from the first distance d1.

Figure 12C:
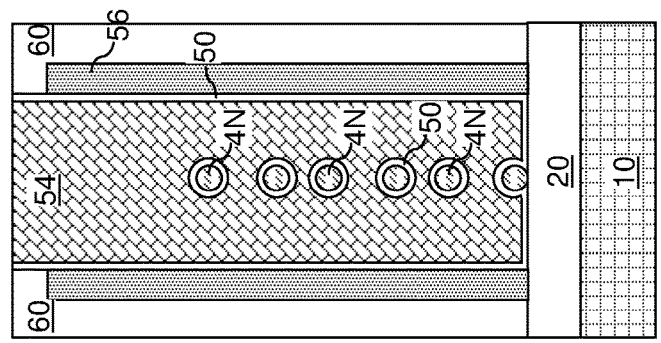
FIG. 12C is a vertical cross-sectional view of the variation of the exemplary semiconductor structure along the vertical plane C-C' of FIG. 12A.
Figure 12A:
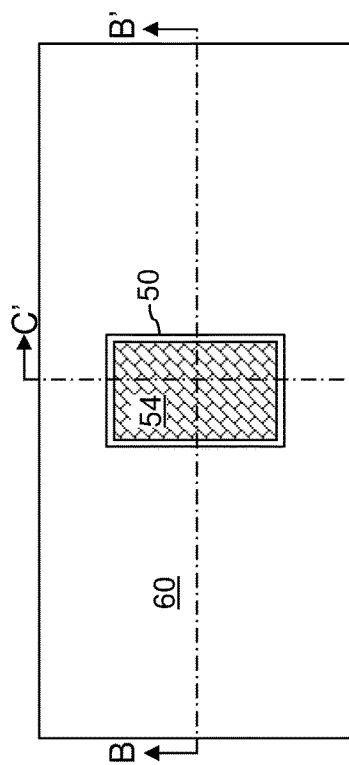
FIG. 12A is a top-down view of the variation of the exemplary semiconductor structure after formation of a replacement gate structure according to a second embodiment of the present disclosure.
Figure 12B:
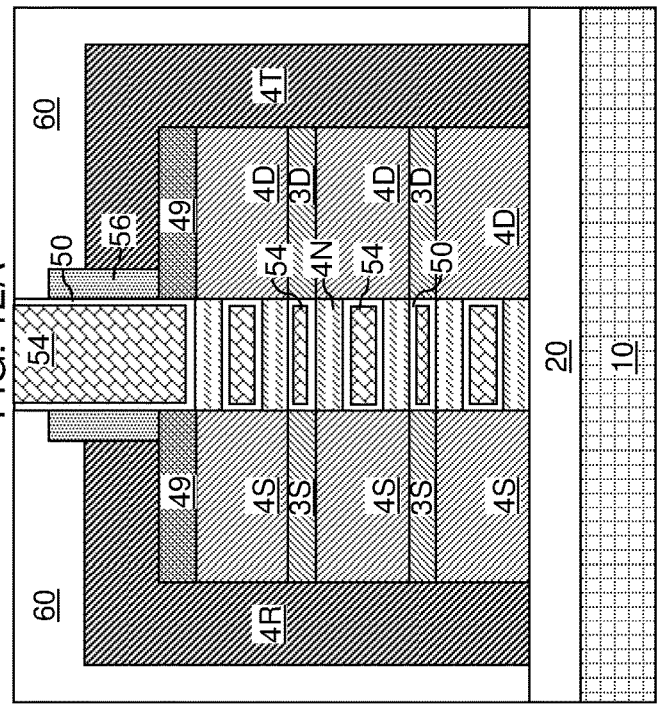
FIG. 12B is a vertical cross-sectional view of the variation of the exemplary semiconductor structure along the vertical plane B-B' of FIG. 12A.

Referring to FIGS. 12A-12C, a replacement gate structure (50, 54) can be formed in the gate cavity 59 by performing the processing steps of FIGS. 10A-10C.

The embodiments of the present disclosure can be employed to double the number of semiconductor nanowires from any given number of first semiconductor material layers 40L because a pair of semiconductor nanowires can be formed from each first semiconductor material layer 40. Thus, the embodiments of the present disclosure can be employed to increase the number of semiconductor nanowires formed per unit area without excessive increase in the processing cost. The increased number of semiconductor nanowires can be advantageously employed to increase the on-current of field effect transistors formed from the semiconductor nanowires.

While the present invention has been described employing a replacement gate scheme in which a disposable gate structure is replaced with a replacement gate structure, embodiments employing a gate-first scheme are expressly contemplated herein in which a permanent gate structure is formed prior to formation of a planarization dielectric layer.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
    forming an alternating stack containing first semiconductor material portions and at least one second semiconductor material portion on a substrate, wherein a cap material portion is present on the alternating stack;
    forming a disposable gate structure across a portion of said cap material portion and said alternating stack;
    forming a raised source region from exposed sidewall portions of said alternating stack and on one side of said disposable gate structure, and a raised drain region on exposed sidewall portions of said alternating stack and on another side of said disposable gate structure drain, wherein said raised source region extends onto a topmost surface of said cap material portion and the raised drain region extends onto said topmost surface of said cap material portion;
    removing said disposable gate structure to provide a gate cavity;
    patterning each of said first semiconductor material portions into a contiguous patterned semiconductor material portion containing a lower semiconductor nanowire having a vertical cross-sectional shape of an upright triangle, an upper semiconductor nanowire having a vertical cross-sectional shape of an inverted triangle, a semiconductor material source portion adjoined to said lower and upper semiconductor nanowires and in contact with a portion of said raised source region, and a semiconductor material drain portion adjoined to said lower and upper semiconductor nanowires and in contact with a portion of said raised drain region, wherein said semiconductor drain material portion is spaced from said semiconductor material source portion by said lower and upper semiconductor nanowires;

removing said cap material portion inside said gate cavity, while maintaining a source cap material portion between a topmost surface of said semiconductor material source portion and said raised source region, and a drain cap material portion between a topmost surface of said semiconductor material drain portion and said raised drain region;

removing a sub-portion of said at least one second semiconductor material portion selective to said contiguous patterned semiconductor material portions;

forming a gate dielectric on surfaces of said lower and upper semiconductor nanowires; and forming a gate electrode structure on said gate dielectric.

2. The method of claim 1, wherein said patterning of said first semiconductor material portions is performed by a crystallographic etch that provides different etch rates for different crystallographic orientations of a semiconductor material of said first semiconductor material portions.

3. The method of claim 2, wherein said crystallographic etch comprises an anisotropic etch.

4. The method of claim 1, wherein an entirety of said alternating stack is single crystalline.

5. The method of claim 1, wherein said at least one second semiconductor material portion is present between each vertically neighboring pair of first semiconductor material portions among said alternating stack prior to patterning said first semiconductor material portions.

6. The method of claim 1, further comprising:

forming, prior to said patterning, a planarization dielectric layer over said alternating stack and around said disposable gate structure.

7. The method of claim 1, wherein surfaces of said lower and upper semiconductor nanowires are crystallographic semiconductor surfaces adjoined to one another by edges.

8. The method of claim 1, wherein each first semiconductor material portion comprises a silicon-containing semiconductor material having an atomic concentration of silicon of greater than 80%, and wherein each second semiconductor material portion comprises a germanium-containing semiconductor material portion in which an atomic concentration of germanium is greater than 20%.

9. The method of claim 1, wherein each first semiconductor material portion comprises a first single crystalline compound semiconductor material, and each second semiconductor material portions comprises a second single crystalline compound semiconductor material, wherein said second single crystalline compound semiconductor material has a different etch rate than said first single crystalline compound semiconductor material.

10. The method of claim 1, wherein said alternating stack is formed by:

providing alternating layers of at least one first semiconductor material layer and at least one second semiconductor material layer; and patterning said alternating layers.

11. The method of claim 1, wherein said forming said raised source region and said raised drain region comprises a selective epitaxy process.

* * * * *